United States Patent [19]
Yoshino

[11] Patent Number: 6,063,649
[45] Date of Patent: May 16, 2000

[54] DEVICE MOUNTING A SEMICONDUCTOR ELEMENT ON A WIRING SUBSTRATE AND MANUFACTURING METHOD THEREOF

[75] Inventor: Rieka Yoshino, Tokyo, Japan

[73] Assignee: NEC Corporation, Tokyo, Japan

[21] Appl. No.: 09/247,617

[22] Filed: Feb. 10, 1999

Related U.S. Application Data

[62] Division of application No. 08/874,277, Jun. 13, 1997, Pat. No. 5,959,362.

[30] Foreign Application Priority Data

Jun. 13, 1996 [JP] Japan ................................. 8-152476

[51] Int. Cl.$^7$ ........................... H01L 21/44; H01L 21/48; H01L 21/50
[52] U.S. Cl. .................... 438/118; 438/106; 438/110; 438/119
[58] Field of Search ............................ 438/118, 119, 438/110, 106

[56] References Cited

U.S. PATENT DOCUMENTS

| | | | |
|---|---|---|---|
| 4,903,118 | 2/1990 | Iwade . | |
| 5,442,240 | 8/1995 | Mukerji . | |
| 5,508,228 | 4/1996 | Nolan et al. . | |
| 5,629,566 | 5/1997 | Doi et al. . | |
| 5,734,201 | 3/1998 | Djennas et al. . | |
| 5,786,271 | 7/1998 | Ohida et al. . | |
| 5,801,435 | 9/1998 | Otsuki . | |
| 5,805,422 | 9/1998 | Otake et al. . | |
| 5,818,113 | 10/1998 | Iseki et al. . | |

FOREIGN PATENT DOCUMENTS

| | | |
|---|---|---|
| 4-82241 | 3/1992 | Japan . |
| 5-166961 | 7/1993 | Japan . |
| 5-299469 | 11/1993 | Japan . |
| 7-52741 | 6/1995 | Japan . |

*Primary Examiner*—Kevin M. Picardat
*Assistant Examiner*—D. Mark Collins
*Attorney, Agent, or Firm*—Sughrue, Mion, Zinn, Macpeak & Seas, PLLC

[57] ABSTRACT

Two kinds of first and second adhesive components 8a, 8b are used to a joining treatment for connecting a protruded electrode 6 of a semiconductor element 5 and a substrate wiring 3 of a wiring substrate 1. The first adhesive component 8a is at a central portion on the surface of the semiconductor element 5 to be joined with the wiring substrate, in which the first adhesive component 8a is formed, and the second adhesive component 8b is disposed in a region at the periphery thereof having the protruded electrode 6. Further, the cure-shrinkage of the first adhesive component 8a is made greater than that of the second adhesive resin 8b and the modulus of elasticity of the second adhesive component 8b is made greater than that of the first adhesive component 8a such that the thermal expansion of the second adhesive component 8b in the high temperature circumference does not exceeds the cure-shrinkage during curing of the first adhesive 8a. Further, the curing temperature of the first adhesive component is made lower than that of the second adhesive component.

8 Claims, 5 Drawing Sheets

DEVICE MOUNTING A SEMICONDUCTOR ELEMENT ON A WIRING SUBSTRATE AND MANUFACTURING METHOD THEREOF

This is a Divisional Application No. 08/874,277 filed Jun. 13, 1997 now U.S. Pat. No. 5,959,362, the disclosure of which is incorporated herein by reference.

BACKGROUND OF THE INVENTION

1. Field of the Invention

The present invention concerns a device mounting a semiconductor element, such as an IC and LSI having multi-terminal and narrow pitch electrodes, on a wiring substrate, and more in particular, it relates to the device mounting the semiconductor element by an adhesive material and a method for mounting.

2. Description of the Prior Art

Conventionally, there is a device mounting a semiconductor elements, for example, IC and LSI having multi-terminal and narrow pitch electrodes on a wiring substrate by an adhesive material. A example of the device will be explained with reference to FIGS. 1A, 1B, 1C and FIG. 2.

Figure 1A:
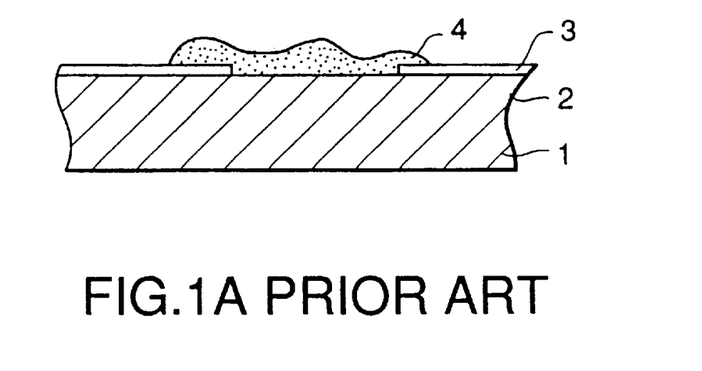
FIG. 1A–FIG. 1C are cross sectional views illustrating an example of manufacturing a device mounting a semiconductor element on a substrate in the prior art.

As shown in FIG. 1A, an insulative resin 4 for adhesion is at first applied to a wiring substrate 1. The wiring substrate 1 is made, for example, of ceramic, glass or glass epoxy resin on the surface of a basic material 2 having a substrate wiring 3. The substrate wiring 3 is made of Cr, Ar, Al, Cu, ITO and the like which is prepared by forming a substrate wiring metal by sputtering or vapor deposition and then etching the wiring substrate metal while leaving a portion of resist for forming the substrate wiring and etching the substrate wiring metal, or using a printing process. The insulative resin 4 comprises a UV-curable or thermoset type epoxy, silicone or acrylic resin.

Figure 1B:
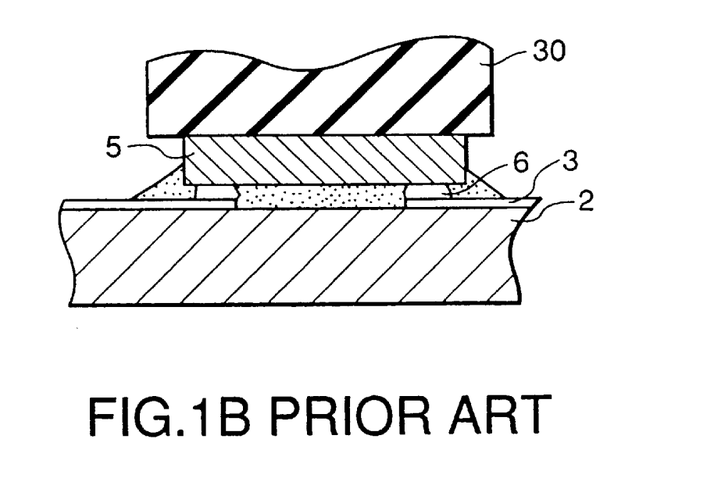

As shown in FIG. 1B, a protruded electrode 6, for example, made of Au, Ag or Cu formed on the semiconductor element 5 by way of electric plating or the like is positionally aligned with the substrate wiring 3 and then the semiconductor element 5 is pressed by a pressing member 30 and pressed against the basic material 2 of the wiring substrate 1. The protruded electrode of the semiconductor element 5 is pressed against the wiring substrate 1, and the UV-curable or thermoset adhesive insulative resin 4 between the semiconductor element 5 and the substrate wiring 3 is driven out.

Then, in the state pressing the semiconductor element 5 by the pressing member 30, the adhesive insulative resin 4 is cured by UV-rays if the resin is the UV-curable type or cured by heat if the resin is the thermoset type, and the pressure is released and the semiconductor element 5 is secured to the wiring substrate 1.

Figure 1C:
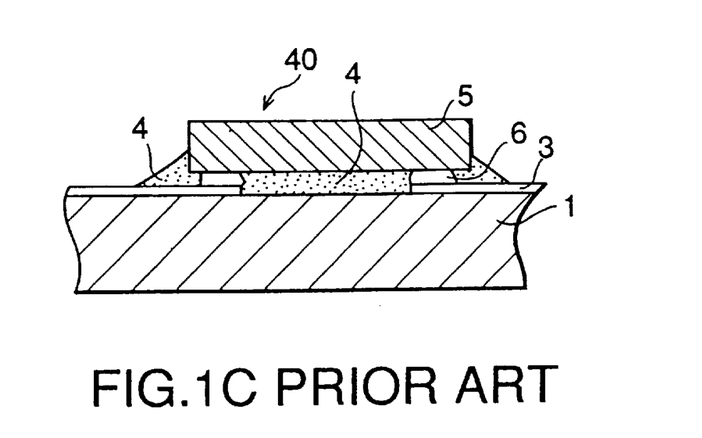
Figure 2:
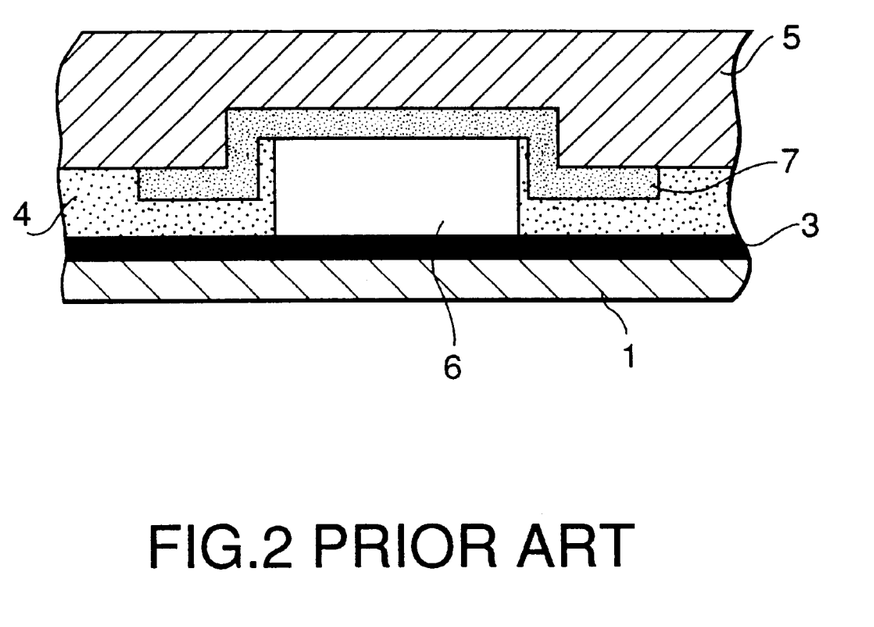
FIG. 2 is a cross sectional view illustrating an example for the constitution of connection between protruded electrodes of the semiconductor element and a substrate wiring in the prior art.

FIG. 1C is a view illustrating a cross sectional structure of a completed semiconductor device 40 after removing the pressing member 30. The protruded electrode 6 formed under the aluminum electrode 7 (FIG. 2) and the substrate wiring 3 are connected electrically.

However, in the prior art described above, since the UV curable or thermoset adhesive insulative resin is used for the connection between the protruded electrode of the semiconductor element and the wiring substrate, the following problems are present.

That is, in a case of use under a high temperature circumstance or by using a semiconductor element of highly heat generating semiconductor element such as a power module, the adhesive insulative resin expands under the thermal effect, and if the expansion of the insulative resin is greater than the shrinkage of the insulative resin during curing of adhering the semiconductor element to the wiring substrate, a gap is formed between the protruded electrode and the substrate wiring to bring about a problem of causing electric connection failure.

As a method of overcoming such a problem, it has been proposed a method of overcoming the foregoing problem by making the coefficient of thermal expansion of the insulative resin smaller than the coefficient of thermal expansion of the protruded electrode as disclosed, for example, in Japanese Patent Publication Hei 7-52741 published on Jun. 5, 1995.

However, such a method results in a problem of causing breakage in the semiconductor element or the wiring substrate if the coefficient of thermal expansion of the insulative resin is made smaller than the coefficient of thermal expansion of the protruded electrode. This drawback is caused, for example, by the following reason. For reducing the coefficient of thermal expansion of the adhesive insulative resin, a filler such as silicone is generally filled at a high ratio to the insulative resin but this increases young's modulus (modulus of elasticity) to apply a large stress to the semiconductor element and the wiring substrate.

As disclosed in Japanese Patent Laid-Open Hei 4-82241 published on Mar. 16, 1992, it has been proposed for overcoming the foregoing problem to form a highly elastic insulative resin layer between the basic material of the substrate wiring and the substrate wiring and they are secured by the adhesive insulative resin in a state of elastically deforming the substrate wiring. The protruded electrodes of the semiconductor element are elastically secured to the wiring of the wiring substrate by the highly elastic insulative resin layer.

However, since the method proposed above utilizes the elastic deformation of the insulative resin layer for the connection between the protruded electrode of the semiconductor element and the substrate wiring, when the semiconductor element is pressed toward the wiring substrate, the wiring substrate and the insulative resin layer are deformed by a slight force to apply stresses to the wiring substrate.

Further, the heat curing of the adhesive insulative resin requires heat at a temperature higher than the glass transition temperature Tg of the basic material for the wiring substrate (the glass transition temperature Tg of the basic material for the wiring substrate is, for example, about 120° C. and, accordingly, a temperature of 170 to 250° C. is required for the curing). When the adhesive insulative resin is expanded under a high temperature circumstance and if the amount of expansion exceeds the amount of shrinkage, an elastic recovery of the insulative resin layer between the substrate wiring and the wiring substrate is eliminated, because the insulative layer resin is deformed not elastically but plastically even by a slight pressure. Therefore, the protruded electrode of the semiconductor element and the substrate wiring can not be brought into contact and no electric connection can be attained.

SUMMARY OF THE INVENTION

An object of the present invention is to overcome the drawbacks in the prior art described above and provide, a device having efficient and excellent connection maintaining effect by a simple method, particularly, the device in which a semiconductor element is mounted on a wiring substrate by a adhesive material, as well as provide a method of manufacturing the semiconductor device described just above.

According to the present invention, the device mounting the semiconductor element on the wiring substrate uses the semiconductor element of a multi-terminal and narrow pitch IC or LSI having a plurality of protruded electrodes formed on one surface thereof. The wiring substrate have a conductor wiring portion formed on a surface of the substrate, and the protruded electrodes and the wiring portion are connected electrically with each other. The semiconductor element is connected by a face-down method to the wiring substrate.

The protruded electrodes of the semiconductor element and the conductor wiring portion formed on the wiring substrate are are secured to each other by an adhesive material. The adhesive material comprises a first adhesive component and a second adhesive component having cure-shrinkage, curing temperature and modulus of elasticity different. Further, the first adhesive component and the second adhesive component are disposed respectively to regions different from each other. This constitution can attain the foregoing object.

Specifically, the first adhesive component is disposed at a position corresponding to a substantially central portion on the plane of a semiconductor element, while the second adhesive component is disposed at the periphery of the first adhesive component.

Further, the amount of cure-shrinkage of the first adhesive component is larger than the curing shrinkage of the second adhesive component, the curing temperature of the first adhesive component is lower than the curing temperature of the second adhesive component, and the modulus of elasticity of the second adhesive component is larger than the modulus of elasticity of the first adhesive component.

Accordingly, when the first adhesive component reaches the curing temperature, since the second adhesive component is still in a fluidizing state (not-cured state), the first adhesive component can be shrunk exceeding its usual shrinkage being compressed by the cure-shrinkage. Further, in the subsequent working circumstance, the elasticity of the second adhesive component can provide an effect capable of preventing peeling between the protruded electrodes of the semiconductor element and the wiring portion of the wiring substrate by the elasticity of the second adhesive component.

The second adhesive component may be disposed at the periphery of the first adhesive component while surrounding the electrodes of the semiconductor element.

In this case, in a first construction, it is preferred that the curing shrinkage of the first adhesive component is larger than the cure-shrinkage of the second adhesive component, the coefficient of thermal expansion of the second adhesive component is equal with or smaller than the coefficient of thermal expansion of the electrode, the curing temperature of the first adhesive component is lower than the curing temperature of the second adhesive component, and the modulus of elasticity of the second adhesive component is larger than the modulus of elasticity of the first adhesive component.

In a second construction, it is preferred that the coefficient of thermal expansion of the first adhesive component is greater than the coefficient of thermal expansion of the electrodes of the semiconductor element, the coefficient of thermal expansion of the second adhesive component is equal with or smaller than the coefficient of the electrode, the curing temperature of the first adhesive component is lower than the curing temperature of the second adhesive component, and the modulus of elasticity of the first adhesive component is smaller than the modulus of elasticity of the second adhesive component.

The above first and second constitutions can provide the advantageous effects as described above, as well as can prevent that the electrode of the semiconductor substrate is raised and apart from the wiring substrate by the thermal expansion of the second adhesive component.

More specifically, the first adhesive component is a thermoset epoxy resin, and the second adhesive component comprises the thermoset epoxy resin incorporated with an inorganic filler.

Further, the present invention provides a method of manufacturing a device by electrically connecting a protruded electrode disposed to a semiconductor element and a conductor wiring portion formed on the wiring substrate. In the method, an adhesive component comprised of a first adhesive component and a second adhesive component having different cure-shrinkage, curing temperature and modulus of elasticity, are simultaneously supplied and deposited to a region predetermined for contact with the semiconductor element, such that positions for arranging the first and the second adhesive components are different from each other. Then, the semiconductor element heated to a predetermined temperature is brought into press contact from above the adhesive material to the wiring substrate.

Further, the present invention provides another method of manufacturing a device by electrically connecting a protruded electrode disposed to a semiconductor element and a conductor wiring portion formed on a wiring substrate. In the method, an adhesive material having such a property as changing the characteristic thereof by the application of a local heat treatment in a subsequent step, is supplied and disposed to a region which is predetermined for contact with the semiconductor element. Then, the semiconductor element heated at a predetermined portion to a temperature higher than the curing temperature of the adhesive, is brought into press contact from above the adhesive material to the wiring substrate, thereby forming bubbles in the heated region of the adhesive material to constitute the first adhesive component, and the region of other portion not forming bubbles is constituted as the second adhesive component thereby conducting an adhesive treatment.

DETAILED DESCRIPTION OF THE PREFERRED EMBODIMENTS

Figure 3A:
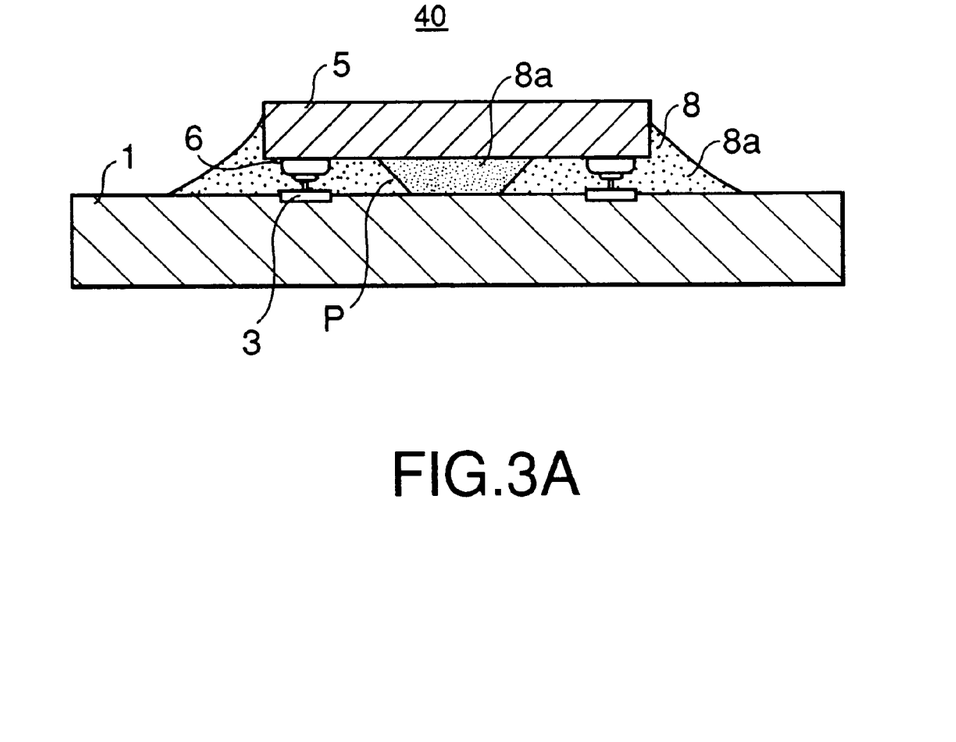
FIG. 3A and FIG. 3B are cross sectional views for a device as a first embodiment according to the present invention.
Figure 3B:
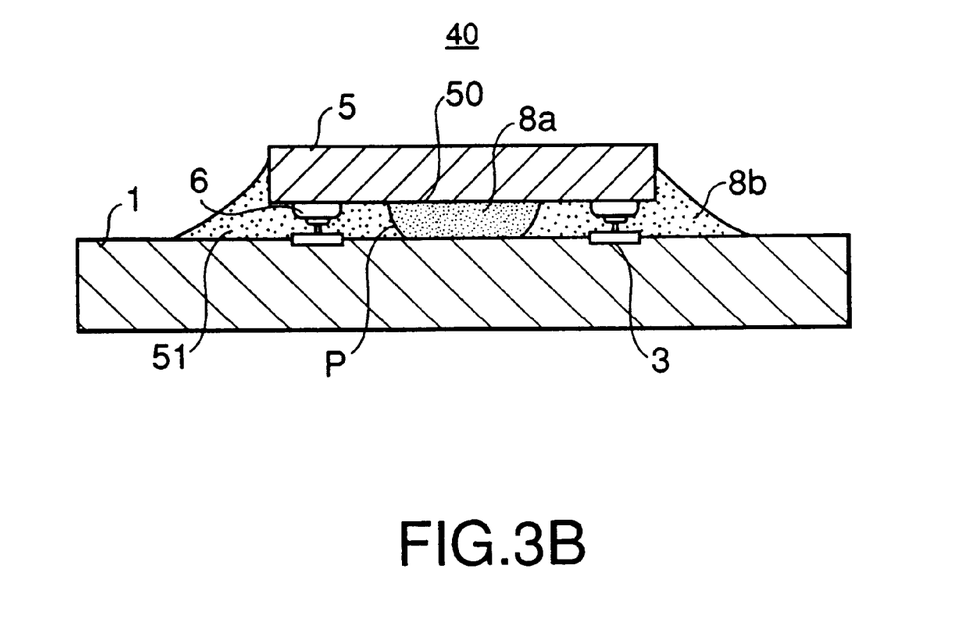

Preferred embodiment for a device and a method of manufacturing the same according to the present invention will be explained more in details with reference to the drawings. In FIG. 3A–FIG. 3B, a device 40 comprises a semiconductor element 5 and a wiring substrate 1. Protruded electrodes 6 of the semiconductor element 5 and a conductor wiring portion 3 formed on the wiring substrate 1 are connected electrically. The semiconductor element 5 and the wiring substrate 1 are secured to each other by means of an adhesive material 8 comprising a first adhesive component 8a having the first characteristic described later and a second adhesive component 8b having a second characteristic described later.

The first adhesive component 8a and the second adhesive component 8b in the adhesive material 8 are disposed in regions different from each other. Namely, the first adhesive component 8a is disposed to a first region 50 corresponding substantially to a central portion on the bottom of the semiconductor element 5, while the second adhesive component 8b is disposed to a second region 51 at the periphery of the first adhesive component 8a. The protruded electrode 6 is present in the second region 51.

There is no particular restriction for the material of the adhesive material 8 and epoxy type resins are generally used and, among them, a thermoset epoxy resin is used preferably. Further, while at least two kinds of adhesive components, that is, the first component 8a and the second component 8b are used for the adhesive material 8, both of them may be constituted with epoxy resins.

It is desirable that the first characteristic of the first adhesive component 8a and the second characteristic of the second adhesive component 8b have a relationship as described below.

At first, the cure-shrinkage of the first adhesive component 8a is greater than the cure-shrinkage of the second adhesive component 8b.

Secondary, the characteristics are selected such that a coefficient of thermal expansion t1 of the first adhesive component 8a is greater than a coefficient of thermal expansion t of the electrodes 6 disposed to the semiconductor element 5, and a coefficient of thermal expansion t2 of the second adhesive component 8b is smaller than the coefficient t of the electrode 6 (t1>t>t2).

Thirdly, glass transition temperature (that is the curing temperature) Tg1 of the first component adhesive 8a is smaller than the glass transition temperature Tg2 of the second adhesive component 8b (Tg1<Tg2).

Fourthly, the modulus of elasticity E2 of the second adhesive material 8 is greater than the modulus of elasticity E1 of the first adhesive component 8a (E1<E2)

As described above, the first and the second characteristics are those regarding the relationship of the cure-shrinkage, coefficient of thermal expansion, glass transition temperature (curing temperature) and modulus of elasticity for the first and the second adhesive materials 8a, 8b. Thermoset adhesive insulative resins known at present have larger coefficient of thermal expansion as the cure-shrinkage is greater, whereas the coefficient of thermal expansion is smaller as the cure-shrinkage is smaller. This trend is remarkable particularly in thermoset epoxy resins. Accordingly, the relationship for the cure-shrinkage and the coefficient of thermal expansion can be generally attained simultaneously.

In the present invention, it is required that the relationship can be satisfied at least for the glass transition temperature and the modulus of elasticity. Preferably, the relationship for the cure-shrinkage is satisfied additionally.

In a case of preventing peeling of the second adhesive component 8b from the wiring substrate 1 by the expansion of the electrode 6, it is necessary that the coefficient t2 of thermal expansion of the second adhesive component 8b is made smaller than the coefficient t of the electrodes 6.

More specifically, in order to attain all the relationships for the cure-shrinkage, the coefficient of thermal expansion and the modulus of elasticity, the epoxy resin not incorporated with a filler is used for the first adhesive component 8a, while the epoxy resin incorporated with a predetermined amount of a filler, for example, an inorganic filler such as silica is used for the second adhesive component 8b.

In the present invention, so long as the adhesive material 8 comprised of the first adhesive component 8a having the first characteristic and the second adhesive component 8b having the second characteristics capable of satisfying the relationship described above is used, there is no particular restriction for the composition thereof.

Explanation will be made to the method of manufacturing the device 40 by way of actual examples with reference to FIG. 4A to FIG. 4D.

In the manufacturing method, an epoxy resin not containing an inorganic filler is used as the first adhesive component 8a and an epoxy resin containing more than 65% of an inorganic filler is used as the second adhesive component 8b.

Figure 4A:
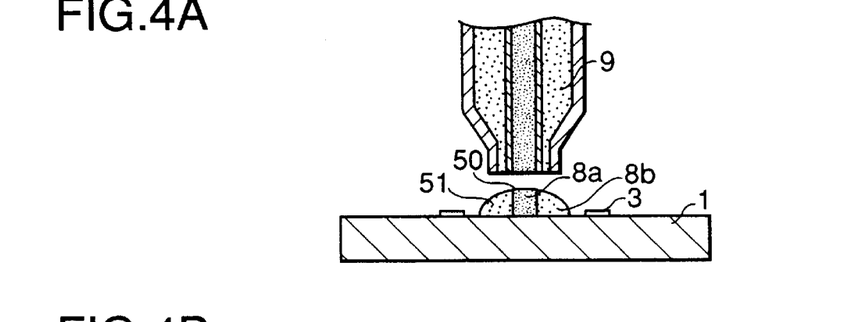
FIG. 4A–FIG. 4C are cross sectional views illustrating a cross sectional structure for explaining the method of manufacturing the device as the first embodiment according to the present invention.

As shown in FIG. 4A, a resin supply syringe 9 of a double walled structure supplies the adhesive material 8 comprises of the first adhesive component 8a having the first characteristic and the second adhesive component 8b having the second characteristic independently of each other. The first adhesive component 8a is supplied to a central region of the wiring substrate 1 as the first region 50, while the second adhesive component 8b is supplied to the periphery thereof to form a concentric region, that is, a second region 51.

Figure 4B:
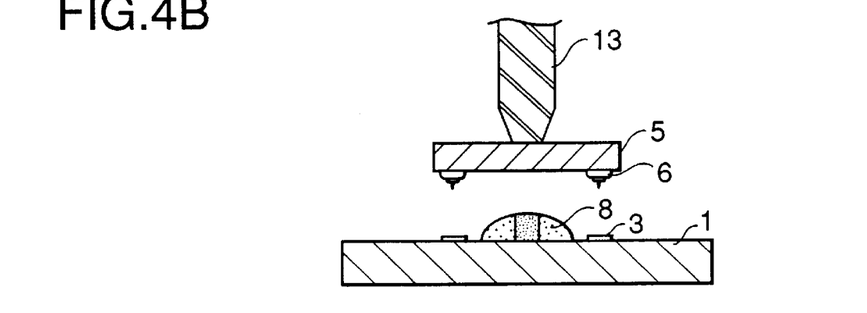
Figure 4C:
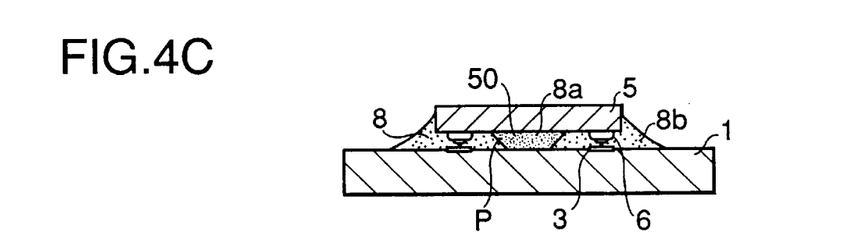
Figure 4D:
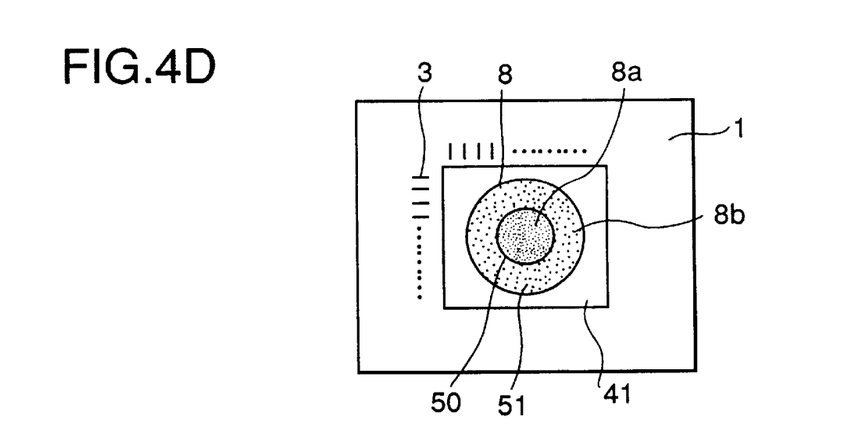
FIG. 4D is a plan view of a semiconductor element after supplying an adhesive material as shown in FIG. 4A.

The arrangement and the position for the supply of the adhesive material 8 are predetermined, as shown in FIG. 4D, such that the semiconductor element 5 situates at a central region of the predetermined region 41 to which the semiconductor element 5 is disposed. That is, the position for supplying the adhesive material 8 is preferably in a region inward of the protruded electrodes 6 of the semiconductor element 5. The shape in the direction of the plane may be different depending on the method of supply.

Then, as shown in FIG. 4B, in a flip chip adhesive device, a mounting procedure for the semiconductor element 5 is conducted by using a gripping jig 13 which is kept at a predetermined temperature and serves also as a heat supply source, while holding the semiconductor element 5 by attraction or like other mechanism and positioning to a predetermined joining position with the wiring substrate 1 such that the protruded electrode 6 of the heated semiconductor element 5 is in a face-down.

In this case, the semiconductor element 5 is supplied with heat energy from the jig 13 and heated to a temperature within a range from 170° C. to 230° C. It is necessary that the heating temperature is set higher than the glass transition temperature Tg1 of the first adhesive component 8a having the first characteristic.

Since the first adhesive component 8a having the first characteristic at first shrinks during curing simultaneously with the start of a curing reaction undergoing the heat from the semiconductor element 5, adhesion treatment proceeds while reducing the distance between the semiconductor element 5 and the wiring substrate 1. Meanwhile, the second adhesive component 8b having the second characteristic disposed to the outside of the first adhesive component 8a is still in a fluidizing state since the curing reaction does not proceed yet. Accordingly, the second adhesive component 8b is diffused and leached out to the outside beyond the joining point between the protruded electrodes 6 and the substrate wiring 3 by the pressure from the jig 13 as shown in FIG. 4C.

On the other hand, as shown in FIG. 4A and FIG. 4B, when the adhesive material 8 is supplied to the inside of the substrate wiring 3 of the wiring substrate 1, the adhesive material is raised such that the height of the member on the wiring substrate is higher than the gap between the semiconductor element 5 and the wiring substrate 1 upon contact of the protruded electrodes 6 with the substrate wiring 3. As a result, when the adhesive material 8 is collapsed before the protruded electrodes 6 of the semiconductor element 5 is in contact with the substrate wiring 3 to be described later, the structure as shown in FIG. 4C is formed in which the area of contact of the first adhesive component 8a in the first region 50 is made greater on the side of the semiconductor element 5 than the area of contact on the side of the wiring substrate 1.

The heating state of the semiconductor element 5 is determined depending on the relation for the size of the jig 13 and the semiconductor element 5. The semiconductor element 5 may be heated uniformly or heated not uniformly in accordance with the curing temperature of the two kinds of adhesive materials being supplied.

That is, in the present invention, at the time the first adhesive component 8a reaches the curing temperature, since the second adhesive component 8b is still in the fluidizing state and deformable, the second adhesive component 8b can be shrunk more than in the usual shrinkage being compressed toward the central portion by the cure-shrinkage of the first adhesive component 8a. After pressing the semiconductor element 5 to the wiring substrate 1 by the jig 13 and curing the first adhesive material 8a, the heating temperature from the jig 13 is elevated to higher than the glass transition temperature Tg2 of the second adhesive component 8b. This causes curing of the second adhesive component 8b to complete manufacture. Curing of the second adhesive component 8b may be started either before or after the completion of curing of the first adhesive component 8a.

After the completion of curing, the device 40 may sometimes be exposed to a high temperature circumstance in the actual working circumstance. In this case, the first adhesive component 8a is thermally expanded. However, since the modulus of elasticity of the second adhesive component 8b is greater than that of the first adhesive component 8a, expansion of the adhesive component 8a is absorbed by the elasticity of the second adhesive material 8b. Further, since the coefficient thermal expansion of the second adhesive component 8b is set equal with or less than that of the protruded electrodes 6, when the second adhesive component 8b is thermally expanded, raising and detachment the protruded electrodes 6 from the wiring substrate 1 by the second adhesive component 8b can be prevented. Accordingly, peeling between the protruded electrode 6 and the substrate wiring 3 in the high temperature circumstance can be prevented.

By making the difference between the cure-shrinkage and the thermal expansion for the first adhesive component 8a and the second adhesive component 8b, stability for the junction between the protruded electrodes 6 and the substrate wiring 3 due to the thermal expansion of the resin can be improved. As a result of a further study for the structure of the joining portion between the first adhesive component 8a and the second adhesive component 8b, the boundary P between the first adhesive material and the second adhesive material is formed as a tapered shape in a cross section vertical to the plane of the semiconductor element or the wiring substrate as shown in FIG. 4C and FIG. 3A, or formed as a curved shape as shown in FIG. 3B. Further, in the structure as shown in FIG. 4C, the area of contact of the first adhesive component 8a in the first region 50 is made greater on the side of the semiconductor element 5 than on the side of the wiring substrate 1. This is because the temperature of the semiconductor element 5 is higher than that of the wiring substrate 1, and the higher temperature spreads the first adhesive component 8a at the semiconductor element side. The shape of the boundary P described above relaxes stress concentration due to the difference of the modulus of elasticity between both of the adhesive components. Accordingly, this further contributes to the prevention of peeling between the protruded electrodes 6 and the substrate wiring 3, and the stability of the joined portion can be improved.

The function and the effect derived from the constitutions of the semiconductor device 40 described above are summarized as below.

That is, for connecting the protruded electrodes 6 of the semiconductor element 5 and the substrate wiring 3 of the wiring substrate 1, the adhesive material 8 comprised of two kinds of adhesive components having characteristics different from each other is used and joined, and the adhesive insulative resin 8 forms an adhesive structure to form two regions 50 and 51 independently of each other as shown in FIG. 3A and FIG. 3B. In particular, the first region 50 is at the central portion of the adhesive structure in which the first adhesive component 8a having the first characteristic is formed there, and the second region 51 is disposed to a region at the periphery of the region 1 having the protruded electrodes 6. Further, the area of the first adhesive component 8a in contact with the semiconductor element 5 is made greater than the area in contact with the wiring substrate 1. Further, the first adhesive resin 8a of large cure-shrinkage is disposed in the first region, and the resin 8b of smaller thermal expansion amount is disposed to the second region 51 forming the periphery thereof to make difference greater between both of the characteristics in appearance, such that the thermal expansion amount of the second adhesive component 8b is not made greater than the cure-shrinkage of the first adhesive component 8a upon curing in a high temperature circumstance.

As a result, when the first adhesive component 8a reaches a curing temperature, since the second adhesive component 8b is still in a fluidizing state (not cured state), the first adhesive component 8a can be shrunk greater than in the usual shrinkage being compressed by the cure-shrinkage of the first adhesive component 8a. Further, after the completion of the manufacture, the first adhesive component 8a is expanded being heated by the working temperature. However, since the modulus of elasticity of the second adhesive component 8b is greater than that of the first adhesive component 8a, expansion of the first adhesive component 8a can be absorbed and-suppressed. Accordingly, peeling between the protruded electrode 6 and the substrate wiring 3 can be prevented effectively.

This can improve the stability for the joined portion between the protruded electrodes 6 and the substrate wiring 3 due to the thermal expansion of the adhesive insulative resin.

Further, in the present invention, the tapered cross sectional shape shown in FIG. 3A and FIG. 3B can prevent concentration of stresses due to the difference of the modulus of elasticity between the first and the second adhesives and can moderate stress concentration. Further, since the coefficient of thermal expansion of the second adhesive component 8b is set equal with or less than the protruded electrodes 6, when the second adhesive component 8b is thermally expanded, raising and detachment of the protruding electrodes 6 by the adhesive 8b from the wiring substrate 1 can be prevented.

Explanation has been made to the first embodiment according to the present invention with respect to the state of previously providing two kinds of adhesive components having different characteristics and supplying both of them simultaneously, but the present invention is not restricted only to the first embodiment. For example, it is also possible to use one kind of an adhesive insulative resin that is changed into adhesive components having the characteristics different from each other when the component is supplied and then subjected to heat curing.

Description will be made to a second embodiment according to the present invention with reference to FIG. 5A and FIG. 5B.

Figure 5A:
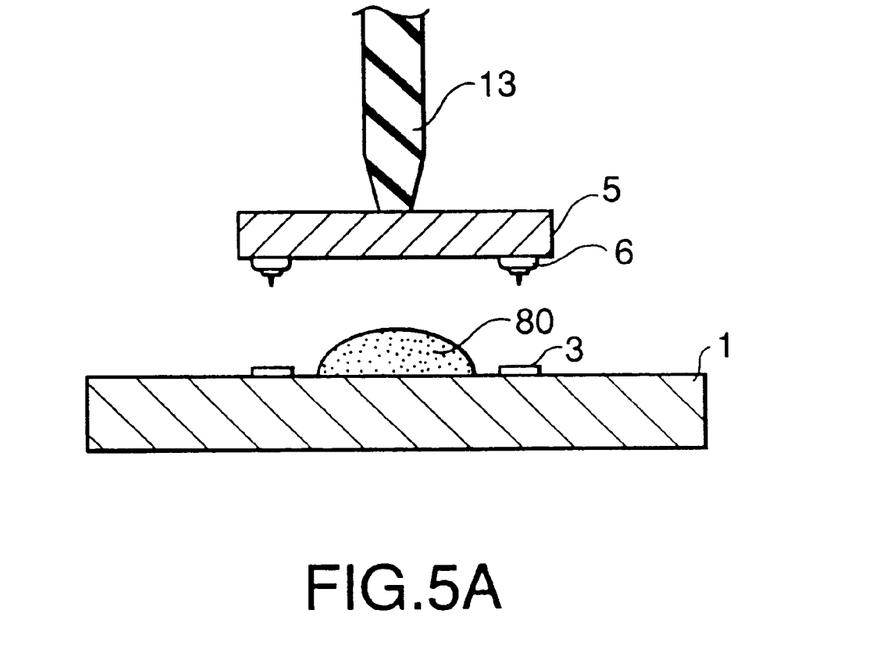
FIG. 5A–FIG. 5B are cross sectional views illustrating a cross sectional structure for explaining the method of manufacturing a device as a second embodiment according to the present invention.

As shown in FIG. 5A, an adhesive material 80 is supplied by a supply syringe or spatula to the inner side of the wiring substrate 3 in which the substrate wiring 3 is formed. The adhesive material 80 is preferably a one pack type thermoset epoxy type resin.

Then, as shown in FIG. 5A, the substrate wiring 3 of the wiring substrate 1 and protruded electrodes 6 of the semiconductor element 5 are joined, the semiconductor element 5 is directed to the wiring substrate 1 by a holding jig 13 served also as a heat source for heating the semiconductor element 5 and flip chip adhesive treatment is applied with the protruded electrodes 6 being face down, thereby urging the semiconductor element 5 from above the adhesive material 80 to the wiring substrate 1.

The holding jig 13 is desirably has a reduced area of gripping contact with the semiconductor element 5 as much as possible, by which only the central portion of the semiconductor element 5 is heated to an extremely high temperature.

It is desirable that the curing reaction temperature for the one pack type thermoset epoxy resin used for the adhesive material 80 is desirably from 170 to 190° C. and, accordingly, the top end of the holding jig 13 is preferably heated to 200° C. to 230 üÄ.

Accordingly, when the device is manufactured by electrically connecting the protruded electrodes 6 of the semiconductor element 5 and the conductor wiring portion 3 formed on the wiring substrate 1, the adhesive material 80 having such a property that the characteristics thereof is changed by applying local heat treatment in the succeeding step is supplied and deposited to a substantially central portion of a region previously determined for contact with the semiconductor element 5. Then, the semiconductor element 5 heated at a central portion to 200–230° C. by the jig 13 is brought into press contact with the adhesive material 80 from above the adhesive material 80. Thus, as shown in FIG. 5B, the region 50 as a portion of the adhesive material constitutes a first adhesive component 80a having the first characteristic and the region for other portion constitutes a second adhesive component 80b having the second characteristic. That is, the first adhesive component 80a having the first characteristic of the adhesive material 80 is disposed to a position corresponding to a substantially central portion on the plane of the semiconductor element, while the second adhesive component 80b having the second characteristic is disposed to the periphery of the first adhesive component.

In the second embodiment, a temperature difference is formed positively along the plane of the semiconductor element 5. When the semiconductor element 5 is in contact with the adhesive material 80, a central portion of the adhesive material 80 first in contact with the semiconductor element 5 causes curing reaction in an earlier stage and, as a result, forms bubbles in the resin portion. On the other hand, the adhesive material 80 in the second region 51 in contact with the semiconductor element 5 at the portion other than heated to the high temperature causes no further reaction since it undergoes heat by the heat transfer from the resin portion causing the reaction and, accordingly, does not form bubbles in the resin portion of the region 51. Difference in the curing reaction is formed along the direction of the plane in the adhesive material 8 depending on the absence or presence of the bubbles.

The portion in the adhesive material 80 (central portion) forming the bubbles and the portion not forming the bubbles (peripheral portion) naturally have characteristics different from each other. As shown in FIG. 5B, the first adhesive component 80a and the second adhesive component 80b having different characteristic can form a structure disposed in divided or partitioned different regions 50 and 51.

By appropriately selecting the resin components and the temperature, two kinds of the first adhesive component 80a and the second adhesive component 8b capable of satisfying the conditions described above can be formed.

Figure 5B:
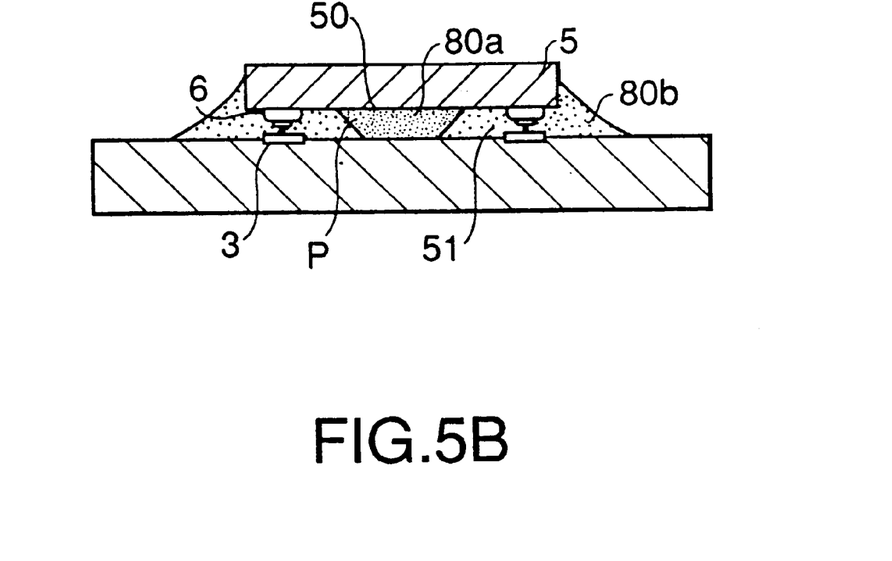

In FIG. 5B, the first adhesive component 80a constituting the first region 50 having the bubbles and the second adhesive component 80b constituting the second region 51 at the periphery thereof, have physical properties in such a relation that the resin having the bubbles has a larger apparent shrinkage and an increased apparent coefficient of thermal expansion and a lowered apparent modulus of elasticity, so that the structure identical with that of the first embodiment described above can be formed.

Further, in the second embodiment, the gripping jig 13 is heated to a high temperature, and the semiconductor element 5 in contact with the gripping jig 13 is heated to a high temperature at the central portion. Therefore, the central portion of the adhesive material 8 in contact with the portion heated to the high temperature is cured to such an extent as rapidly forms bubbles, and processing time for manufacture can be shortened from ¼ to ⅙.

As described above in the device according to the present invention, by making the apparent difference between the cure-shrinkage and the expansion of the adhesive insulative resin, stability for the joined portion between the protruded electrode and the substrate wiring due to the heat expansion of the adhesive insulative resin can be improved.

Further, in the present invention, the cross sectional structure for the joined portion between the first adhesive component and the second adhesive component having different characteristics is formed into a tapered shape, stress concentration caused by the difference of the modulus of elasticity between the adhesive components having different characteristics constituting the adhesive insulative resin can be prevented and the concentration of the stresses can be moderated, so that peeling of the joined portion between the protruded electrode and the substrate wiring can be prevented also in this regard.

Further, in the present invention, since there is no requirement for using any special resin, the cost is reduced to provide an economical merit.

That is, the characteristic of the resin required so far in the mounting method is that the cure-shrinkage is large and the thermal expansion is small. However, if the filler or the like is incorporated in a great amount in order to reduce the heat expansion, the cure-shrinkage is generally reduced as well.

In the existent resins, a one pack thermosetting resin in which the amount of the thermal expansion does not exceed the cure-shrinkage in a high temperature circumstance has not yet been put to practical use and novel development has been demanded. However, it is extremely difficult to provide a resin with characteristics contrary to each other.

In this regard, in the present invention, since the resin having two kinds of adhesive components having required characteristics respectively are formed in two different regions, the characteristics are shared between them, so that there is no requirement of newly preparing a resin having characteristics contrary to each other.

What is claimed is:

1. A method of manufacturing a device by electrically connecting protruded electrodes formed on a semiconductor element and a conductor wiring portion formed on a wiring substrate, wherein said method comprises the steps of:

depositing an adhesive material comprised of a first adhesive component and a second adhesive component, said second adhesive component having a higher curing temperature than said first adhesive component simultaneously on said wiring substrate in a region predetermined for contact with said semiconductor element such that the positions for disposing said first and said second adhesive components form partitioned regions different from each other;

bringing said semiconductor element on said first adhesive component to press contact with said wiring substrate and heating said semiconductor element to a predetermined temperature higher than the curing temperature of said first adhesive component for curing said first adhesive component while said second adhesive component is in a fluid state; and then curing said second adhesive component by applying a temperature higher than the curing temperature of said second adhesive component.

2. A method of manufacturing a device by electrically connecting protruded electrodes formed on a semiconductor element and a conductor wiring portion formed on a wiring substrate, wherein said method comprises the steps of supplying and depositing a adhesive material having such a property that the characteristics thereof are changed by applying a local heat treatment in a subsequent step on said wiring substrate at a region predetermined for contact with said semiconductor element;

bringing said semiconductor element heated at a predetermined portion to a temperature higher than the curing temperature of said adhesive component from above said adhesive material into press contact with said wiring substrate, thereby forming bubbles in the region for the heated portion of said adhesive material to constitute a first adhesive component; and constituting other region not forming the bubbles into a second adhesive component thereby applying an adhesive treatment.

3. The method of manufacturing the device as defined in claim 1, wherein said first adhesive component is disposed at a position corresponding to a substantially central portion in a joined area between said wiring substrate and said semiconductor element, and said second adhesive component is disposed at the periphery of said first adhesive component.

4. The method manufacturing the device as defined in claim 2, wherein the cure-shrinkage of said first adhesive component is greater than the cure-shrinkage of said second adhesive component, the curing temperature of said first adhesive component is lower than the curing temperature of said second adhesive component, and the modulus of elasticity of said second adhesive component is greater than the modulus of elasticity of said first adhesive component.

5. The method manufacturing the device as defined in claim 2, wherein the protruded electrodes of said semiconductor element is disposed in said second adhesive component.

6. The method manufacturing the device as defined in claim 5, wherein, the cure-shrinkage of said first adhesive component is greater than the cure-shrinkage of said second, adhesive component;

a coefficient of thermal expansion of said second adhesive component is equal with or less than a coefficient of thermal expansion of said protruded electrodes;

the curing temperature of said first adhesive component is lower than the curing temperature of said second adhesive component; and the modulus of elasticity of said second adhesive component is larger than the modulus of elasticity of said first adhesive component.

7. The method of manufacturing the device as defined in claim 3, wherein a boundary between said first adhesive component and said second adhesive component is formed into a tapered shape in a cross section vertical to the plane of said semiconductor element or said wiring substrate.

8. The method of manufacturing the device as defined in claim 7, wherein the boundary between said first adhesive component and said second adhesive component is formed into a tapered shape in a cross section vertical to the plane of said semiconductor element or said wiring substrate.

* * * * *

UNITED STATES PATENT AND TRADEMARK OFFICE
CERTIFICATE OF CORRECTION

PATENT NO. : : 6,063,649
DATED : May 16, 2000
INVENTOR(S) : Rieka YOSHINO

It is certified that error appears in the above-identified patent and that said Letters Patent is hereby corrected as shown below:

Priority Data delete "8-152476" insert --8-152576--

Signed and Sealed this

Tenth Day of April, 2001

*Attest:*

NICHOLAS P. GODICI

*Attesting Officer*     *Acting Director of the United States Patent and Trademark Office*